US010811381B2

(12) United States Patent
Lee et al.

(10) Patent No.: US 10,811,381 B2
(45) Date of Patent: Oct. 20, 2020

(54) WAFER TO WAFER BONDING METHOD AND WAFER TO WAFER BONDING SYSTEM

(71) Applicant: SAMSUNG ELECTRONICS CO., LTD., Suwon-si, Gyeonggi-do (KR)

(72) Inventors: Joon-Ho Lee, Seoul (KR); Sung-Hyup Kim, Hwaseong-si (KR); Ki-Ju Sohn, Gunpo-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/268,651

(22) Filed: Feb. 6, 2019

(65) Prior Publication Data

US 2020/0043884 A1 Feb. 6, 2020

(30) Foreign Application Priority Data

Aug. 3, 2018 (KR) ......................... 10-2018-0090872

(51) Int. Cl.
*H01L 21/68* (2006.01)
*H01L 23/00* (2006.01)
(Continued)

(52) U.S. Cl.
CPC .......... *H01L 24/83* (2013.01); *H01J 37/3244* (2013.01); *H01J 37/32899* (2013.01); *H01L 21/6704* (2013.01); *H01L 21/6719* (2013.01); *H01L 21/67069* (2013.01); *H01L 21/67098* (2013.01); *H01L 21/67167* (2013.01); *H01L 21/67207* (2013.01); *H01L 21/68* (2013.01); *H01L 23/544* (2013.01); *H01L 24/75* (2013.01);
(Continued)

(58) Field of Classification Search
None
See application file for complete search history.

(56) References Cited

U.S. PATENT DOCUMENTS

| 5,131,968 A | 7/1992 | Wells et al. |
| 6,299,713 B1 | 10/2001 | Bejtlich |

(Continued)

FOREIGN PATENT DOCUMENTS

| JP | 2016-143616 | 8/2016 |
| JP | 6110540 | 3/2017 |
| KR | 10-1659303 | 9/2016 |

OTHER PUBLICATIONS

Hopcroft et al. "What is the Young's Modulus of Silicon?" Journal of Microelectromechanical Systems, vol. 19, No. 2, Apr. 2010 pp. 229-2338.*

*Primary Examiner* — Bradley Smith
(74) *Attorney, Agent, or Firm* — F. Chau & Associates, LLC

(57) ABSTRACT

A wafer to wafer bonding method includes performing a plasma process on a bonding surface of a first wafer, pressurizing the first wafer after performing the plasma process on the bonding surface of the first wafer, and bonding the first wafer to a second wafer. The plasma process has different plasma densities along a circumferential direction about a center of the first wafer. A middle portion of the first wafer protrudes after pressurizing the first wafer. The first wafer is bonded to the second wafer by gradually joining the first wafer to the second wafer from the middle portion of the first wafer to a peripheral region of the first wafer.

13 Claims, 11 Drawing Sheets

(51) Int. Cl.
  *H01L 21/67* (2006.01)
  *H01J 37/32* (2006.01)
  *H01L 25/00* (2006.01)
  *H01L 25/18* (2006.01)
  *H01L 27/146* (2006.01)
  *H01L 23/544* (2006.01)
  *H01L 29/04* (2006.01)
  *H01L 21/683* (2006.01)

(52) U.S. Cl.
  CPC .............. *H01L 25/18* (2013.01); *H01L 25/50* (2013.01); *H01L 27/1469* (2013.01); *H01L 27/14634* (2013.01); *H01J 37/321* (2013.01); *H01J 37/32715* (2013.01); *H01J 2237/334* (2013.01); *H01L 21/67092* (2013.01); *H01L 21/6838* (2013.01); *H01L 29/045* (2013.01); *H01L 2223/54426* (2013.01); *H01L 2223/54493* (2013.01); *H01L 2224/7501* (2013.01); *H01L 2224/753* (2013.01); *H01L 2224/7555* (2013.01); *H01L 2224/75744* (2013.01); *H01L 2224/75753* (2013.01); *H01L 2224/8313* (2013.01); *H01L 2224/83022* (2013.01); *H01L 2224/83031* (2013.01); *H01L 2224/83091* (2013.01); *H01L 2224/83203* (2013.01)

(56) References Cited

U.S. PATENT DOCUMENTS

| | | |
|---|---|---|
| 7,105,381 B2 | 9/2006 | Han |
| 7,682,933 B1 * | 3/2010 | Loomis ................ H01L 25/50 |
| | | 257/E21.122 |
| 7,980,287 B2 | 7/2011 | Hwang |
| 8,083,853 B2 | 12/2011 | Choi et al. |
| 8,304,324 B2 | 11/2012 | Huff |
| 8,475,612 B2 | 7/2013 | Gaudin |
| 8,869,742 B2 | 10/2014 | Dhindsa et al. |
| 8,894,767 B2 | 11/2014 | Chug et al. |
| 9,039,911 B2 | 5/2015 | Hudson et al. |
| 9,117,767 B2 | 8/2015 | Marakhatanov et al. |
| 9,184,028 B2 | 11/2015 | Dhindsa et al. |
| 9,275,840 B2 | 3/2016 | Glukhoy |
| 9,378,971 B1 | 6/2016 | Briggs et al. |
| 9,384,998 B2 | 7/2016 | Hudson et al. |
| 9,418,859 B2 | 8/2016 | Hudson et al. |
| 9,466,538 B1 | 10/2016 | Skordas et al. |
| 9,543,158 B2 | 1/2017 | Hudson et al. |
| 9,839,800 B2 | 1/2017 | Kito et al. |
| 9,620,377 B2 | 4/2017 | Hudson et al. |
| 9,646,843 B2 | 5/2017 | Nguyen et al. |
| 9,704,822 B2 | 7/2017 | Knickerbocker et al. |
| 9,793,126 B2 | 10/2017 | Dhindsa et al. |
| 9,793,128 B2 | 10/2017 | Dhindsa et al. |
| 9,887,097 B2 | 2/2018 | Hudson |
| 9,997,373 B2 | 6/2018 | Hudson |
| 9,997,372 B2 | 8/2018 | Briggs et al. |
| 2006/0240642 A1 * | 10/2006 | Kerdiles ................ H01L 21/263 |
| | | 438/455 |
| 2011/0214814 A1 * | 9/2011 | Iizuka ....................... C23F 1/08 |
| | | 156/345.34 |
| 2013/0059448 A1 | 3/2013 | Marakhtanov et al. |
| 2015/0013793 A1 | 1/2015 | Chuc et al. |
| 2015/0357209 A1 | 12/2015 | Marakhtanov et al. |
| 2016/0079039 A1 | 3/2016 | Dhindsa et al. |
| 2016/0118284 A1 | 4/2016 | Iwai et al. |
| 2016/0148786 A1 | 6/2016 | Marakhtanov et al. |
| 2016/0260617 A1 | 9/2016 | Hudson et al. |
| 2016/0340781 A1 | 11/2016 | Thomas et al. |
| 2016/0368784 A1 | 12/2016 | Hudson et al. |
| 2017/0076955 A1 | 3/2017 | Hudson et al. |
| 2017/0170026 A1 | 6/2017 | Hudson et al. |
| 2017/0178920 A1 | 6/2017 | Dole et al. |
| 2018/0005852 A1 | 1/2018 | Dhindsa et al. |
| 2018/0130637 A1 | 5/2018 | Ayoub et al. |
| 2018/0174858 A1 | 6/2018 | Hudson |

* cited by examiner

WAFER TO WAFER BONDING METHOD AND WAFER TO WAFER BONDING SYSTEM

CROSS-REFERENCE TO RELATED APPLICATIONS

This application claims priority under 35 U.S.C. § 119 to Korean Patent Application No. 10-2018-0090872, filed on Aug. 3, 2018 in the Korean Intellectual Property Office (KIPO), the disclosure of which is incorporated by reference herein in its entirety.

TECHNICAL FIELD

Exemplary embodiments relate to a wafer to wafer bonding method and a wafer to wafer bonding apparatus. More particularly, exemplary embodiments relate to method of bonding wafers to each other to manufacture a semiconductor device having a three-dimensional connection structure, and a wafer to wafer bonding apparatus for performing the same.

DISCUSSION OF THE RELATED ART

In manufacturing electronic products such as a CMOS image sensor (CIS), High Bandwidth Memory (HBM), etc., two wafers may be bonded to each other, thereby improving a yield rate per wafer. The wafer to wafer bonding process may include an $O_2$ plasma activation step, a hydration step, a wafer alignment step, a wafer bonding step, an annealing step, etc. When the two wafers are bonded to each other in the wafer bonding step, an overlay distortion may occur between the bonded wafers.

SUMMARY

Exemplary embodiments provide a wafer to wafer bonding method capable of preventing wafer to wafer misalignment.

Exemplary embodiments provide a wafer to wafer bonding apparatus for performing the wafer to wafer bonding method.

According to an exemplary embodiment, a wafer to wafer bonding method includes performing a plasma process on a bonding surface of a first wafer, pressurizing the first wafer after performing the plasma process on the bonding surface of the first wafer, and bonding the first wafer to a second wafer. The plasma process has different plasma densities along a circumferential direction about a center of the first wafer. A middle portion of the first wafer protrudes after pressurizing the first wafer. The first wafer is bonded to the second wafer by gradually joining the first wafer to the second wafer from the middle portion of the first wafer to a peripheral region of the first wafer.

According to an exemplary embodiment, a wafer to wafer bonding method includes performing a plasma process on a bonding surface of a first wafer, pressurizing the first wafer after performing the plasma process on the bonding surface of the first wafer, and bonding the first wafer to a second wafer. The plasma process has a first plasma density in a first crystal orientation from a center of the first wafer and a second plasma density in a second crystal orientation of the first wafer. A middle portion of the first wafer protrudes after pressurizing the first wafer. The first wafer is bonded to the second wafer by gradually joining the first wafer to the second wafer from the middle portion of the first wafer to a peripheral region of the first wafer.

According to an exemplary embodiment, a wafer to wafer bonding system includes a plasma processing apparatus and a wafer bonding apparatus. The plasma processing apparatus is configured to perform a plasma process on a bonding surface of a first wafer. The plasma process has different plasma densities along a circumferential direction about a center of the first wafer. The wafer bonding apparatus is configured to bond the first wafer to a second wafer by protruding a middle portion of the first wafer toward the second wafer, and gradually joining the first wafer to the second wafer from the middle portion of the first wafer to a peripheral region of the first wafer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Figure 1:
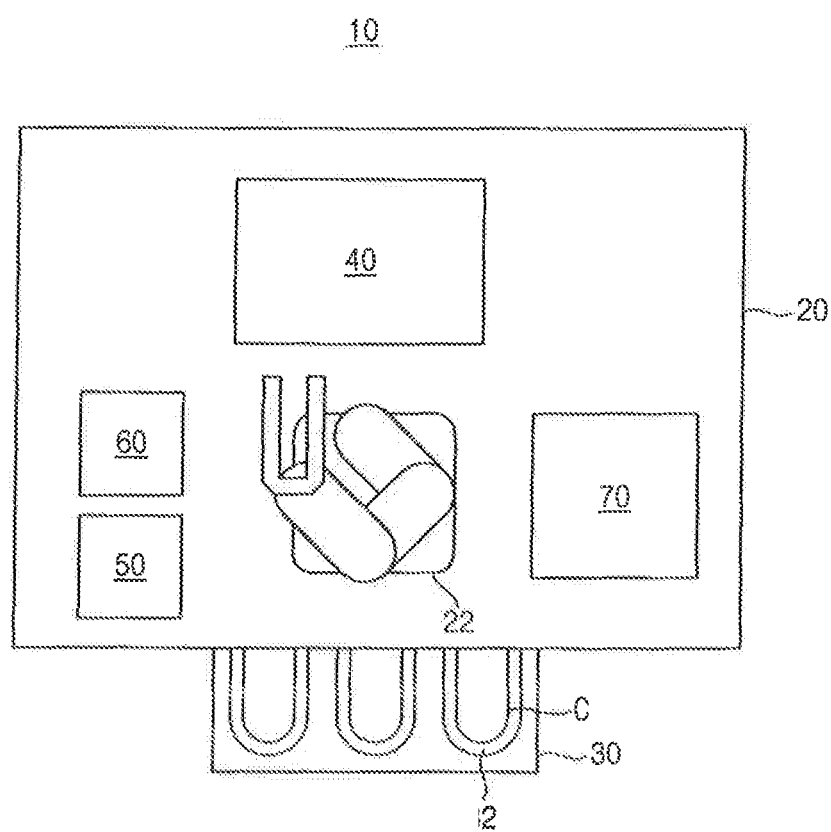
FIG. 1 is a block diagram illustrating a wafer to wafer bonding system according to exemplary embodiments.

Exemplary embodiments will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Further, when two or more elements or values are described as being about equal to each other, it is to be understood that the elements or values are identical to each other, indistinguishable from each other, or distinguishable from each other but functionally the same as each other as would be understood by a person having ordinary skill in the art.

Figure 2:
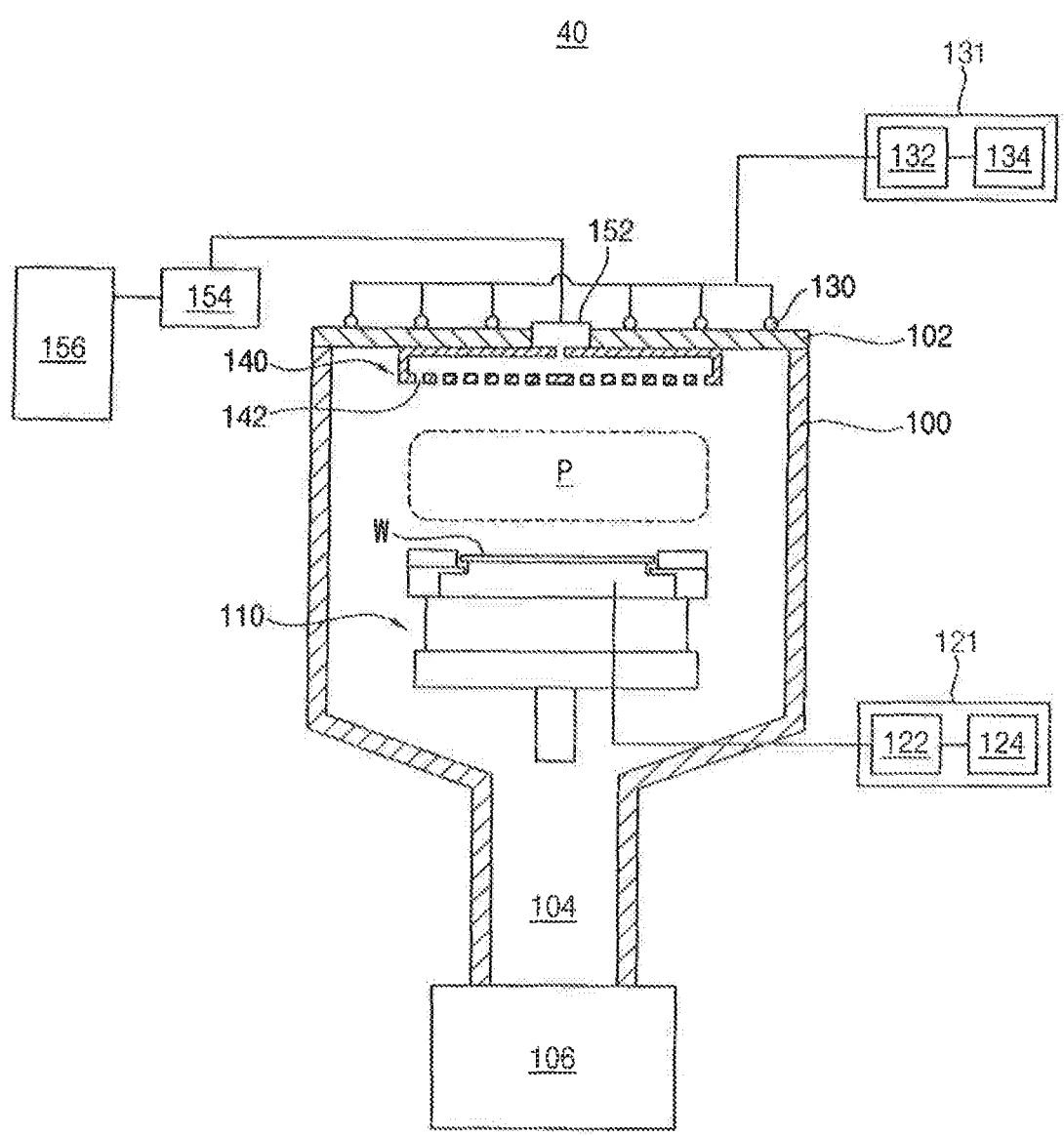
FIG. 2 is a cross-sectional view illustrating a plasma processing apparatus in FIG. 1.
Figure 3:
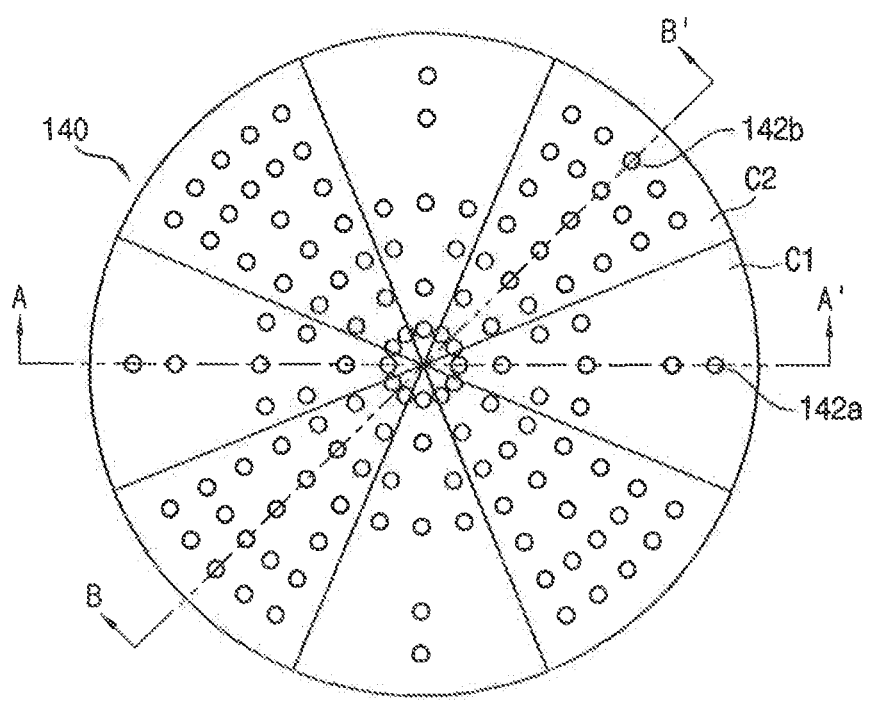
FIG. 3 is a bottom view illustrating a shower head of the plasma processing apparatus in FIG. 2.
Figure 4A:
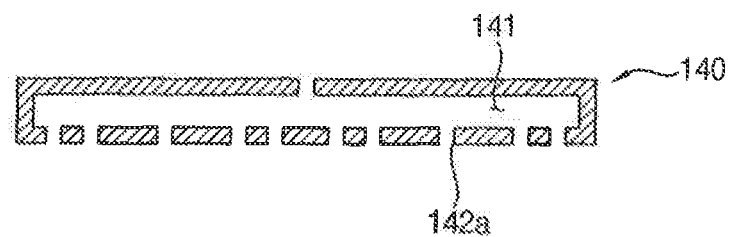
FIG. 4A is a cross-sectional view taken along line A-A' in FIG. 3.
Figure 4B:
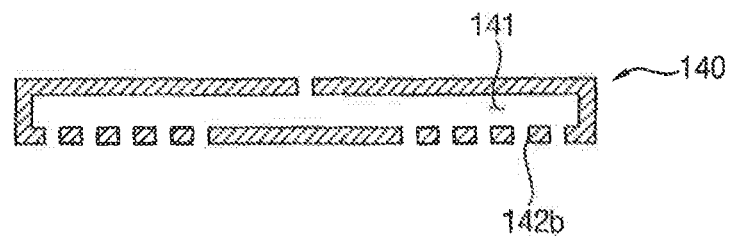
FIG. 4B is a cross-sectional view taken along line B-B' in FIG. 3.
Figure 5:
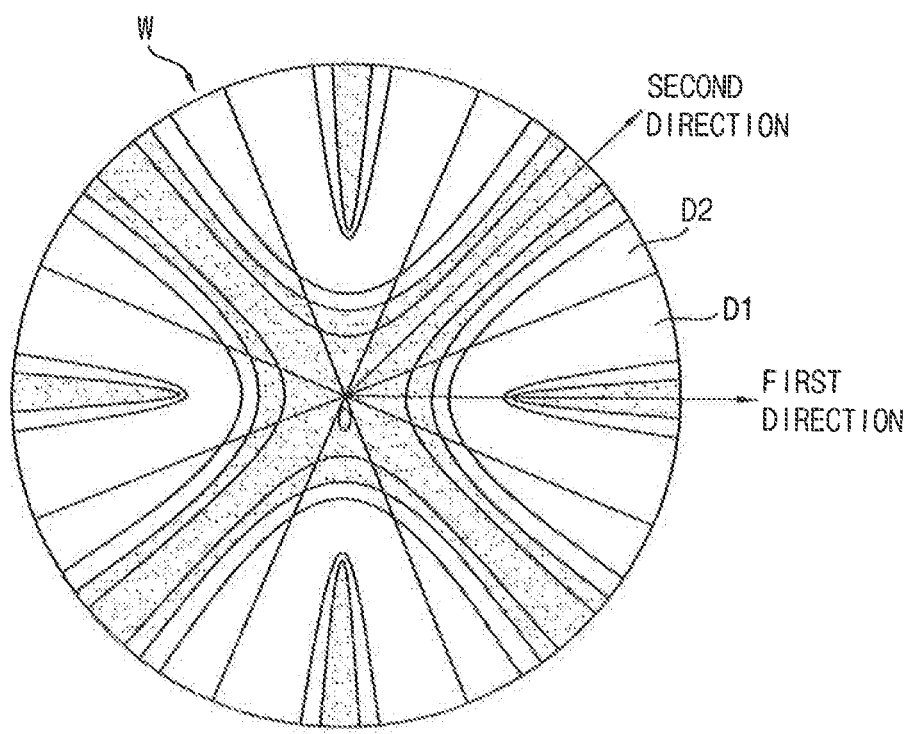
FIG. 5 is a view illustrating an adhesion force distribution on a surface of a wafer is plasma-processed using the shower head of FIG. 3.
Figure 6:
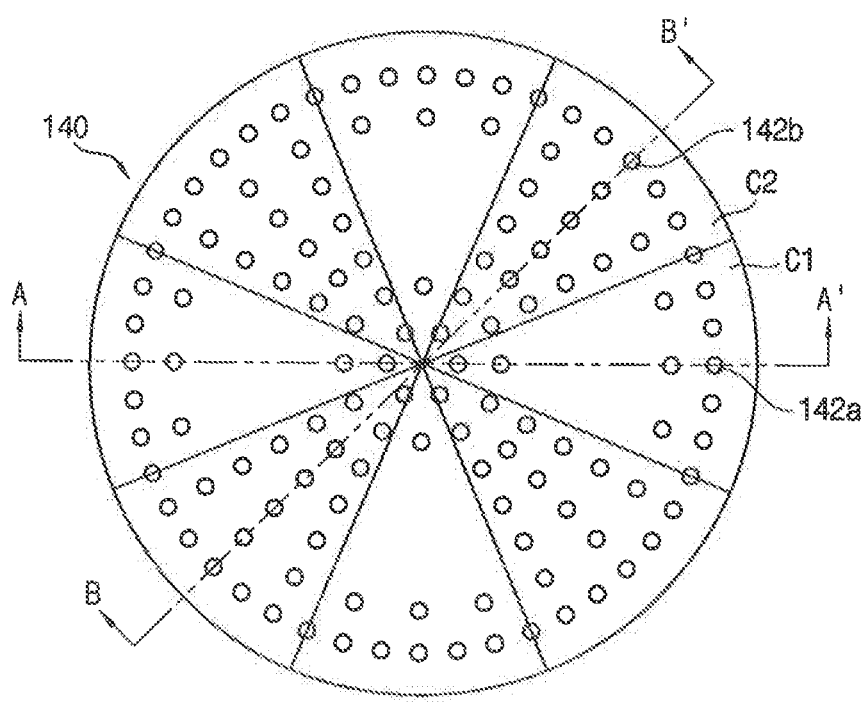
FIG. 6 is a bottom view illustrating the shower head of the plasma processing apparatus according to exemplary embodiments.
Figure 7A:
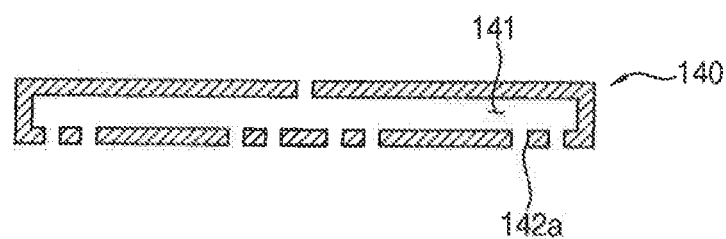
FIG. 7A is a cross-sectional view taken along line A-A' in FIG. 6.
Figure 7B:
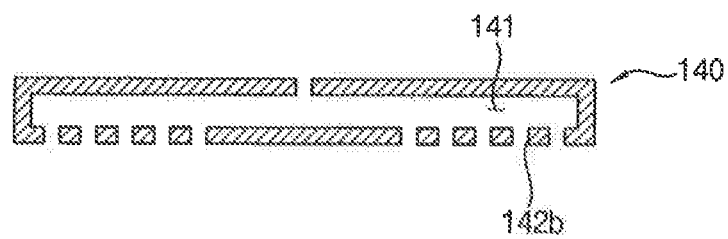
FIG. 7B is a cross-sectional view taken along line B-B' in FIG. 6.
Figure 8:
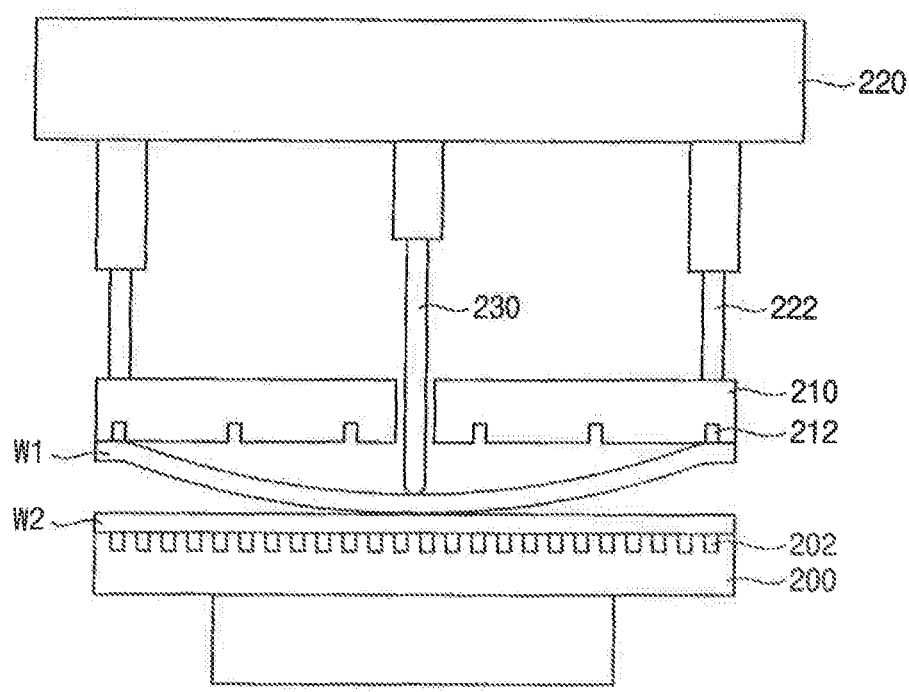
FIG. 8 is a cross-sectional view illustrating the wafer to wafer bonding apparatus in FIG. 1.

FIG. 1 is a block diagram illustrating a wafer to wafer bonding system according to exemplary embodiments. FIG. 2 is a cross-sectional view illustrating a plasma processing apparatus in FIG. 1. FIG. 3 is a bottom view illustrating a shower head of the plasma processing apparatus in FIG. 2. FIG. 4A is a cross-sectional view taken along line A-A' in FIG. 3. FIG. 4B is a cross-sectional view taken along line B-B' in FIG. 3. FIG. 5 is a view illustrating an adhesion force distribution on a surface of a wafer is plasma-processed using the shower head of FIG. 3. FIG. 6 is a bottom view illustrating the shower head of the plasma processing apparatus according to exemplary embodiments. FIG. 7A is a cross-sectional view taken along line A-A' in FIG. 6. FIG. 7B is a cross-sectional view taken along line B-B' in FIG. 6. FIG. 8 is a cross-sectional view illustrating the wafer to wafer bonding apparatus in FIG. 1.

Referring to FIGS. 1 to 8, a wafer to wafer bonding system 10 may include a plasma processing apparatus 40, a cleaning apparatus 50, an aligning apparatus 60, and a wafer bonding apparatus 70. The wafer to wafer bonding system 10 may be arranged in a clean room 20. The wafer to wafer bonding system 10 may further include a cassette stage 30. The cassette stage 30 may be disposed in a side of the clean room 20.

In exemplary embodiments, the clean room 20 may be an enclosed room having a cuboid shape, and may be a controlled environment that has a low level of pollutants such as, for example, dust, airborne microbes, aerosol particles, and chemical vapors.

The cassette stage 30 may provide a space in which wafers are located before being transferred into the clean room 20. A carrier C having a plurality of the wafers received therein may be supported on a support plate 32 of the cassette stage 30. The carrier C may be, for example, a front opening unified pod (FOUP). The wafers received in the carrier C may be transferred into the clean room 20 by a transfer robot 22. For example, three carriers C may be disposed on the cassette stage 30. In exemplary embodiments, first and second wafers to be bonded to each other may be received in first and second carriers C respectively, and bonded wafers may be received in a third carrier C.

In exemplary embodiments, the first wafer may be a wafer in which circuits for an image sensor chip are formed, and the second wafer may be a wafer in which photosensors for the image sensor chip are formed. Alternatively, in exemplary embodiments, the first wafer may be a wafer in which circuits for a semiconductor package such as a High Band Memory (HBM) are formed, and the second wafer may be a wafer in which memories for the semiconductor package are formed.

The aligning apparatus 60 may detect a flat portion (or notch portion) of a wafer W to align the wafer W (see FIG. 2). The wafer aligned by the aligning apparatus 60 may be transferred to the plasma processing apparatus 40 or the wafer bonding apparatus 70 by the transfer robot 22.

As illustrated in FIG. 2, the plasma processing apparatus 40 may include a chamber 100, a substrate support 110 having a lower electrode, an upper electrode 130, and a shower head 140.

The substrate support 110 may support the wafer W within the chamber 100. The substrate support 110 may include a substrate stage having the lower electrode on which the substrate is disposed.

In exemplary embodiments, the chamber 100 may be an induced coupled plasma (ICP) chamber, and the plasma processing apparatus 40 may be an apparatus configured to process plasma on a surface of the substrate such as the wafer W disposed within the ICP chamber 100 to form a dangling bond on the surface of the substrate. However, the plasma generated by the plasma processing apparatus 40 is not limited to inductively coupled plasma utilized in an ICP chamber. For example, exemplary embodiments may utilize capacitively coupled plasma, microwave plasma, etc., which may be generated by the plasma processing apparatus 40.

The chamber 100 may provide a sealed space in which a plasma etch process is performed on the wafer W. The chamber 100 may be, for example, a cylindrically shaped vacuum chamber. The chamber 100 may include a cover 102 which covers an open upper end portion of the chamber 100. The cover 102 may seal the upper end portion of the chamber 100 such that it is airtight.

A gate for opening and closing a loading/unloading port of the wafer W may be provided in a sidewall of the chamber 100. The wafer W may be loaded/unloaded onto/from the substrate stage through the gate.

A gas exhaust port 104 may be provided in a bottom portion of the chamber 100, and a gas exhaust unit 106 may be connected to the gas exhaust port 104 through a gas exhaust line. The gas exhaust unit 106 may include, for example, a vacuum pump, such as a turbo-molecular pump. The vacuum pump may control the pressure of the chamber 100 so that the processing space inside the chamber 100 may be depressurized to a desired vacuum level. In addition, process by-products and residual process gases may be discharged through the gas exhaust port 104.

The upper electrode 130 may be disposed outside the chamber 100 such that the upper electrode 130 faces the lower electrode. For example, the upper electrode 130 may be disposed on the cover 102. Alternatively, the upper electrode 130 may be disposed over the shower head 140 within the chamber 100 or in an upper portion of the chamber 100.

The upper electrode 130 may include a radio frequency antenna. The radio frequency antenna may have, for example, a coil shape. The cover 102 may include a dielectric window, which may have a circular plate shape. The dielectric window may include a dielectric material. For example, the dielectric window may include aluminum oxide ($Al_2O_3$). Power from the antenna may be transferred into the chamber 100 through the dielectric window.

For example, the upper electrode 130 may include coils having a spiral shape or a concentric shape. The coil may generate plasma P (e.g., inductively coupled plasma P) in a space of the chamber 100. It is to be understood that the number, arrangement, etc. of the coils may be variously modified, and are not limited to the exemplary embodiments described herein.

Still referring to FIG. 2, in exemplary embodiments, the plasma processing apparatus 40 may further include a gas supply unit connected to the shower head 140. The gas supply unit may supply a gas into the chamber 100. The gas supply unit may include, for example, a gas supply line 152, a flow controller 154, and a gas supply source 156, which may include gas supply elements. The gas supply line 152 may be connected to an inner space 141 (see FIGS. 4A, 4B, 7A and 7B) of the shower head 140 within the chamber 100.

The shower head 140 may be arranged over the substrate support 110 such that it faces the entire surface of the wafer W, and may spray out a plasma gas onto the surface of the wafer W through a plurality of discharge holes 142. The plasma gas may include a gas such as, for example, $O_2$, $N_2$, $Cl_2$, etc., however, the plasma gas is not limited thereto.

The gas supply source 156 may store the plasma gas, and the plasma gas may be supplied into the chamber 100 through the shower head 140 connected to the gas supply line 152. The flow controller 154 may control an amount of the gas supplied into the chamber 100 through the gas supply line 152. The flow controller 154 may include, for example, a mass flow controller (MFC).

A first power supply 131 may apply a plasma source power to the upper electrode 130. The first power supply 131 may include a source RF power source 134 and a source RF matcher 132 such as, for example, plasma source elements. The source RF power source 134 may generate a radio frequency (RF) signal. The source RF matcher 132 may match impedance of the RF signal generated by the source RF power source 134 using the coils to control generation of plasma.

A second power supply 121 may apply a bias source power to the lower electrode. For example, the second power supply 121 may include a bias RF power source 124 and a bias RF matcher 122 such as, for example, bias elements. The bias RF power source 124 may generate an RF signal. The bias RF matcher 122 may match impedance of the bias RF signal by controlling a bias voltage and bias current applied to the lower electrode. The bias RF power source 124 and the source RF power source 134 may be synchronized or desynchronized with other through a synchronizer of a controller.

The controller may be connected to the first power supply 131 and the second power supply 121, and may control operations thereof. The controller may include a microcomputer and various interface circuits that may be used to control an operation of the plasma processing apparatus 40 based on programs and recipe information stored in an external or internal memory.

As the radio frequency power having a predetermined frequency is applied to the upper electrode 130, an electromagnetic field induced by the upper electrode 130 may be applied to a source gas supplied within the chamber 100 to generate the plasma P. As the bias power having a predetermined frequency less than the frequency of the plasma power is applied to the lower electrode, plasma atoms or ions generated within the chamber 100 may be attracted toward the lower electrode.

In exemplary embodiments, the plasma processing apparatus 40 may perform a local plasma process on a surface of the wafer W. The plasma processing apparatus 40 may perform the plasma process with different plasma densities along at least a circumferential direction about a center with respect to the surface of the wafer W.

For example, the plasma processing apparatus 40 may perform a process with a first plasma density in a first direction from the center O (see FIG. 5) of the wafer W, and may perform a process with a second plasma density in a second direction oriented to the first direction at a predetermined angle along the circumferential direction about the center O of the wafer W. In exemplary embodiments, the second plasma density may be greater than the first plasma density.

As illustrated in FIGS. 3, 4A and 4B, in exemplary embodiments, the plasma processing apparatus 40 may include the shower head 140, which includes a plurality of discharge holes 142. In exemplary embodiments, the discharge holes 142 may be non-uniformly disposed in the shower head 140 along the circumferential direction so as to perform the local plasma process along at least the circumferential direction about the center O (see FIG. 5) of the wafer W.

The shower head 140 may include a plurality of regions, including regions C1 and C2, along the circumferential region. For example, the shower head 140 may include a first region C1 in a first (radial) direction corresponding to a first crystal orientation (the X direction) of the wafer W, and a second region C2 in a second (radial) direction corresponding to a second crystal orientation (about 45° from the X direction). For example, the first crystal orientation of the wafer W may be in a [100] direction and the second crystal direction of the wafer W may be in a [110] direction (see FIGS. 11 and 12). The first region C1 and the second region C2 may be arranged alternately along the circumferential direction about the center O. Each of the first and second regions C1 and C2 may have a sector shape with the central angle of about 45°.

The shower head 140 may include a first group of the discharge holes 142a through which the plasma gas is sprayed out with a first discharge amount in the first crystal orientation of the wafer W, and a second group of the discharge holes 142b through which the plasma gas is sprayed out with a second discharge amount greater than the first discharge amount in the second crystal orientation of the wafer W. The first group of the discharge holes 142a may be formed in the first region C1, and the second group of the discharge holes 142b may be formed in the second region C2.

An opening area of the second group of discharge holes 142b may be greater than an opening area of the first group of discharge holes 142a. That is, the total amount of open area provided by the second group of discharge holes 142b may be greater than the total amount of open area provided by the first group of discharge holes 142a. In exemplary embodiments, this relationship may exist between the first group of discharge holes 142a and the second group of discharge holes 142b in which the size of each discharge hole included in the first group of discharge holes 142a is about equal to the size of each discharge hole included in the second group of discharge holes 142b. In this case, the number of the second group of discharge holes 142b may be greater than the number of the first group of discharge holes 142a. That is, in this case, the size of all discharge holes may be the same, and there may be more discharge holes included in the second group of discharge holes 142b than discharge holes included in the first group of discharge holes 142a. Accordingly, the shower head 140 may spray the plasma gas with the more discharge amount in the second crystal orientation than in the first crystal orientation of the wafer W.

As illustrated in FIG. 5, in exemplary embodiments, a distribution of an adhesion force due to a dangling bond on the surface of the wafer W on which a plasma process is performed using the shower head 140 indicates that the adhesion force generated in a first region D1 in the first crystal orientation from the center O of the wafer W is different from the adhesion force generated in a second region D2 in the second crystal orientation. For example, it may be shown that the adhesion force generated in the second crystal orientation is greater than the adhesion force in the first crystal orientation. Accordingly, an adhesion force in the second crystal direction between the bonded wafers may be relatively increased, and an adhesion force in the first crystal direction between the bonded wafers may be relatively decreased.

As illustrated in FIGS. 6, 7A and 7B, the shower head 140 may include the first group of discharge holes 142a formed in the first region C1 in the first (radial) direction from the center thereof, and the second group of discharge holes 142b formed in the second region C2 in the second (radial) direction oriented to the first direction at a predetermined angle (e.g., about 45°) along the circumferential direction about the center. The number of the second group of discharge holes 142b may be greater than the number of the first group of discharge holes 142a. That is, in exemplary embodiments, the shower head 140 may include more discharge holes in the second group of discharge holes 142b than in the first group of discharge holes 142a.

In addition, as shown in FIG. 6, the number of the discharge holes 142a and 142b in a peripheral region of the shower head 140 may be greater than the number of the discharge holes 142a and 142b in a middle region of the shower head 140. Thus, a distribution of plasma density along a radial direction on the wafer W may be adjusted.

In exemplary embodiments, the distribution of the discharge holes 142a and 142b of the shower head 140 may be adjusted to perform the local plasma process. However, exemplary embodiments are not limited thereto. For example, in exemplary embodiments, the arrangement of the coils as the upper electrode 130 may be adjusted to perform the local plasma process.

Referring again to FIG. 1, the cleaning apparatus 50 may clean the surface of the wafer that has been plasma-processed by the plasma processing apparatus 40. The cleaning apparatus 50 may coat deionized (DI) water on the wafer surface using a spin coater. The DI water may clean the wafer surface and allow —OH radical to be bonded easily on the wafer surface, such that dangling bonds are easily created on the wafer surface.

As illustrated in FIG. 8, the wafer bonding apparatus 70 may include a lower chuck structure and an upper chuck structure. The upper chuck structure may include an upper stage 210 that holds a first wafer W1, and the lower chuck structure may include a lower stage 200 that holds a second wafer W2.

The first wafer W1 may be vacuum suctioned by suction holes 212 of the upper stage 210, and the second wafer W2 may be vacuum suctioned by suction holes 202 of the lower stage 200.

The upper stage 210 may be configured such that it is movable upwardly and downwardly by an elevating rod 222. Accordingly, the upper stage 210 may move the suctioned first wafer W1 toward the second wafer W2 disposed on the lower stage 200. The elevating rod 222 may be fixedly installed to an upper frame 220.

The lower stage 200 may be arranged to face the upper stage 210. The lower stage 200 may be configured such that it is movable translationally and rotationally such that a relative position between the upper stage 210 and the lower stage 200 may be adjusted.

The wafer bonding apparatus 70 may include a push rod 230 for pressurizing a middle region of the first wafer W1. The push rod 230 may be configured such that it is movable through the upper stage 210. For example, the upper stage 210 may include an opening through which the push rod 230 may move through.

After the first and second wafers W1 and W2 are held by the upper stage 210 and the lower stage 200, a wafer bonding process may be performed, as described below.

First, the first wafer W1 may be suctioned on the upper stage 210 with a uniform pressure across the entire surface of the first wafer W1, and the second wafer W2 may be suctioned on the lower stage 200 with a uniform pressure across the entire surface of the second wafer W2.

Then, the push rod 230 may descend toward the lower stage 200 to pressurize the middle portion of the first wafer W1. Thus, the middle portion of the first wafer W1 may protrude downward more than the peripheral region, such that the first wafer W1 is bent downward, as shown in FIG. 8. The peripheral region of the first wafer W1 may be vacuum suctioned by the suction holes 212 of the upper stage 210.

When the first wafer W1 bends downward such that it is downwardly concave, the upper stage 210 may travel downward such that the first wafer W1 contacts the second wafer W2. The middle portion of the first wafer W1 may initially contact the second wafer W2, as shown in FIG. 8, and the remaining portion of the first wafer W1 may then gradually make contact with the second wafer W2 from the middle portion toward the peripheral region, such that the first and second wafers W1 and W2 are joined.

For example, in exemplary embodiments, a bonding surface of the first wafer W1 is pressurized to cause the middle portion of the first wafer W1 to protrude. Then, the first wafer W1 is bonded to the second wafer W2 by gradually joining the first wafer W1 to the second wafer W2 from the middle portion of the first wafer W1 to the peripheral region of the first wafer W1. The peripheral region of the first wafer W1 may refer to the outer edges of the wafer W1. Thus, in exemplary embodiments, the first wafer W1 is first joined to the second wafer W2 at the middle portion of the first wafer W1 (e.g., at a location where the first wafer W1 protrudes most), and is then subsequently gradually joined to the second wafer W2 from the middle portion of the first wafer W1 toward the edges of the first wafer W1.

Then, a vacuum pressure may be removed from the suction holes 212 of the upper stage 210 to bond the first wafer W1 and the second wafer W2 to each other.

The wafer to wafer bonding system 10 may further include an annealing apparatus that may thermally treat the bonded wafers. In addition, the wafer to wafer bonding system 10 may further include a grinding apparatus that grinds a surface of at least one of the bonded wafers. In this case, the grinding apparatus may grind a surface of the wafer in which the photosensors are formed.

Referring to a comparative example, in a wafer bonding step, a middle region of a first wafer may be deformed to protrude, and then may be joined to a second wafer gradually from a middle region to a peripheral region. As a result, after the wafers are bonded to each other, different restoring forces may be generated due to an elastic modulus difference depending on the orientation of a crystal lattice of the first wafer. Thus, an overlay distortion may occur between the bonded wafers.

According to exemplary embodiments, different restoring forces to be generated due to an elastic modulus difference depending on the orientation of the crystal lattice of the wafer between the wafers bonded to each other by the wafer bonding apparatus 70 of the wafer to wafer bonding system 10 may be predicted, and the plasma processing apparatus 40 of the wafer to wafer bonding system 10 may perform the local plasma process corresponding to the orientation of the crystal lattice in a bonding surface of the wafer. As a result, an overlay distortion between the bonded wafers may be prevented or reduced.

Hereinafter, a wafer to wafer bonding method using the wafer to wafer bonding system 10 in FIG. 1 will be described.

Figure 9:
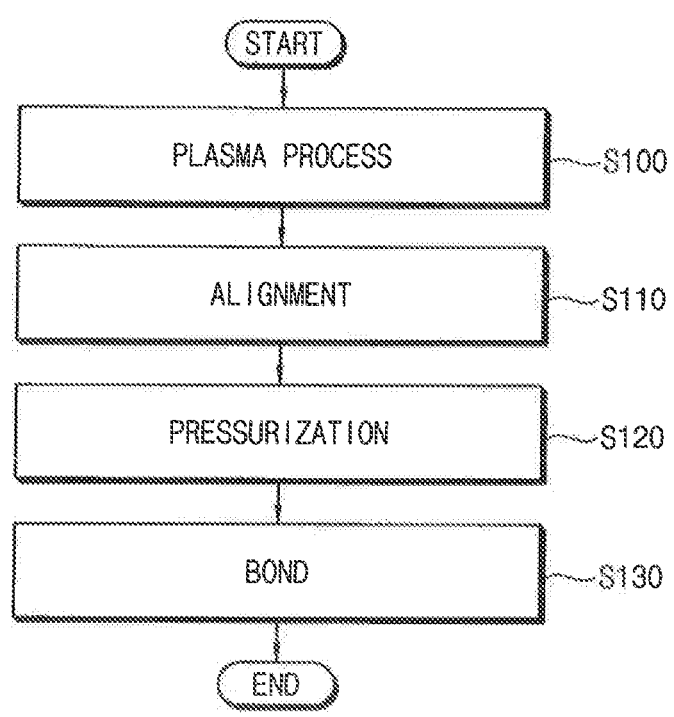
FIG. 9 is a flowchart illustrating a wafer to wafer bonding method according to exemplary embodiments.
Figure 10:
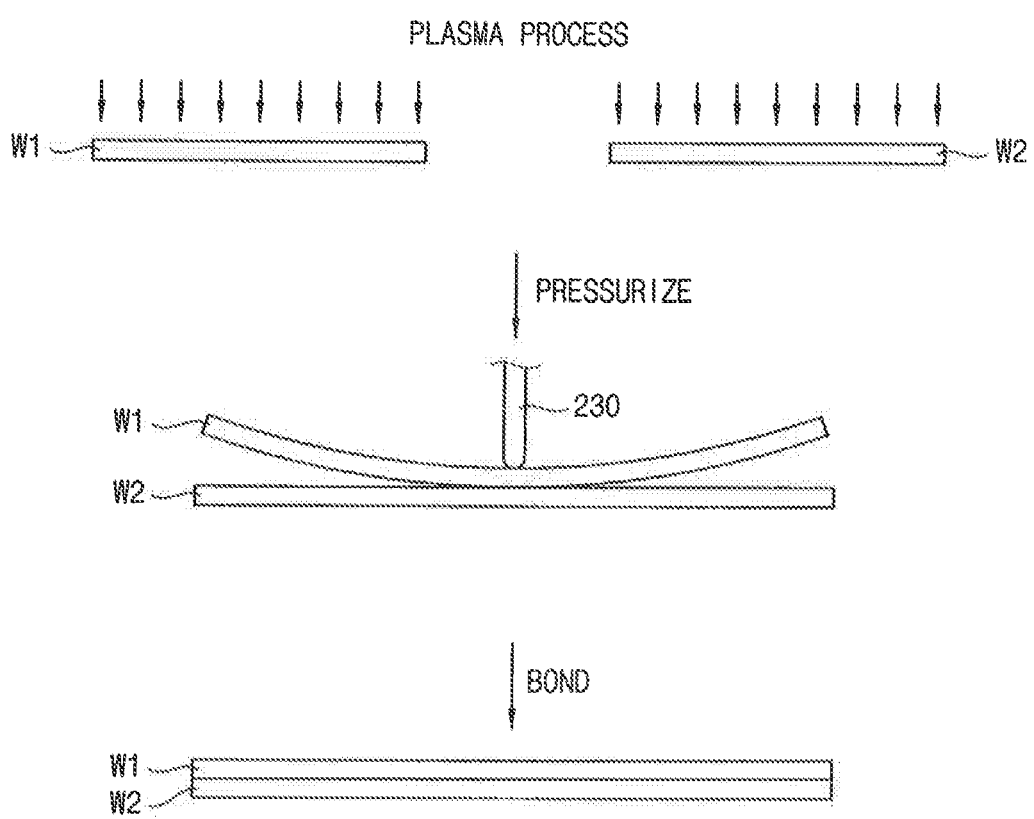
FIG. 10 is a view illustrating the wafer to wafer bonding method in FIG. 9.
Figure 11:
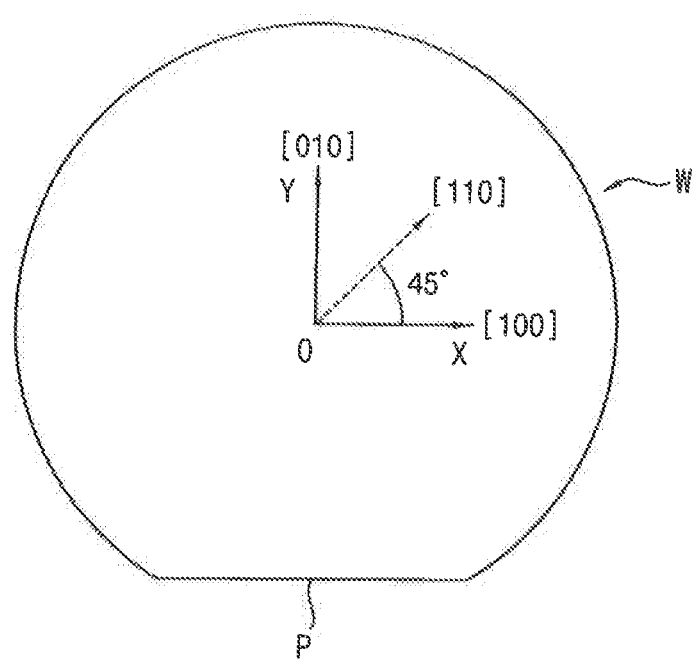
FIG. 11 is a view illustrating a crystal orientation of a wafer.
Figure 12:
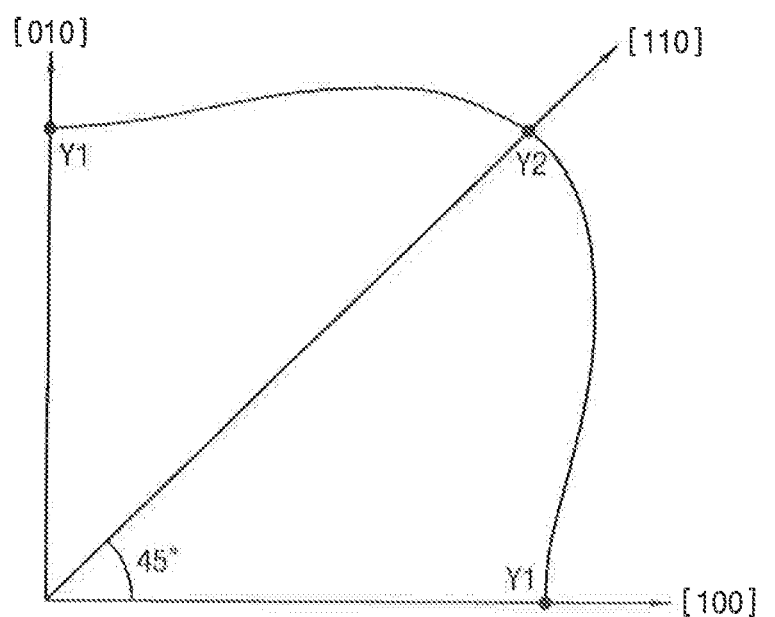
FIG. 12 is a graph illustrating Young's modulus with respect to the crystal orientation in FIG. 11.

FIG. 9 is a flowchart illustrating a wafer to wafer bonding method according to exemplary embodiments. FIG. 10 is a view illustrating the wafer to wafer bonding method in FIG. 9. FIG. 11 is a view illustrating a crystal orientation of a wafer. FIG. 12 is a graph illustrating Young's modulus with respect to the crystal orientation in FIG. 11.

Referring to FIGS. 1, 2, 3 and 8 to 12, first, a local plasma process may be performed on at least one of bonding surfaces of wafers to be bonded to each other (S100).

In exemplary embodiments, the wafer W may be loaded into the chamber 100 of the plasma processing apparatus 40, a plasma gas may be supplied on the wafer W through the shower head 140, and the local plasma process may then be performed within the chamber 100.

First, the semiconductor wafer W may be loaded onto an electrostatic chuck of a substrate stage within the chamber 100. The plasma gas may be introduced into the chamber 100 through discharge holes 142 of the shower head 140, and then, a pressure of the chamber 100 may be controlled to a desired vacuum level by the gas exhaust unit 106.

Then, a plasma power may be applied to the upper electrode 130 to generate plasma within the chamber 100, and a bias power may be applied to the lower electrode to perform the plasma process.

In exemplary embodiments, to form a local plasma density on the wafer W, the plasma gas may be sprayed out with different discharge amounts along a circumferential direction about a center of the wafer W.

The plasma gas may be sprayed out in a first crystal orientation ([100] direction in FIGS. 11 and 12) of the wafer W through the first group of discharge holes 142a of the shower head 140, and the plasma gas may be sprayed out in a second crystal orientation ([110] direction in FIGS. 11 and 12) of the wafer W through the second group of discharge holes 142b of the shower head 140.

In exemplary embodiments, an opening area of the second group of the discharge holes 142b may be greater than an opening area of the first group of the discharge holes 142a. Accordingly, the shower head 140 may spray plasma gas having a greater discharge amount in the second crystal orientation than in the first crystal orientation of the wafer W. Thus, a plasma density in the second crystal orientation may be generated to be greater than a plasma density in the first crystal orientation. Accordingly, an adhesion force in the second crystal orientation on the wafer W may be greater than an adhesion force in the first crystal orientation on the wafer W.

In exemplary embodiments, the surface of the wafer W that has been plasma-processed may be cleaned. DI water may be coated on the wafer surface using a spin coater. The DI water may clean the wafer surface and allow —OH radical to be bonded easily on the wafer surface, such that dangling bonds are easily created on the wafer surface.

The above-described process may be repeated for a plurality of wafers.

Then, the plasma-processed wafers may be aligned (S110), at least one of the wafers may be pressurized such that a middle portion of the wafer protrudes (S120), and then, the wafers may be gradually joined from the middle portion to a peripheral region (S130). For example, referring to operation S130, one of the wafers may gradually make contact with another wafer from the middle portion toward the peripheral region, as described above. This process may also be referred to herein as a bonding process.

In exemplary embodiments, plasma-processed first and second wafers W1 and W2 may be vacuum suctioned on the upper stage 210 and the lower stage 200 of the wafer bonding apparatus 70 (see FIG. 8). The first wafer W1 may be vacuum suctioned by the suction holes 212 of the upper stage 210, and the second wafer W2 may be vacuum suctioned by the suction holes 202 of the lower stage 200.

Then, the push rod 230 may descend to pressurize the middle portion of the first wafer W1 such that the middle portion of the first wafer W1 is bent downward. The peripheral region of the first wafer W1 may be vacuum suctioned by the suction holes 212 of the upper stage 210.

When the first wafer W1 bends downward to be downwardly concave, the upper stage 210 may travel downward such that the first wafer W1 contacts the second wafer W2. The middle portion of the first wafer W1 may initially contact the second wafer W2, and the remaining portion of the first wafer W1 may then gradually make contact with the second wafer W2 from the middle portion toward the peripheral region, such that the first and second wafers W1 and W2 are joined. Then, a vacuum pressure may be removed from the suction holes 212 of the upper stage 210 to bond the first wafer W1 and the second wafer W2 to each other.

The adhesion force in the second crystal orientation ([110] direction in FIGS. 11 and 12) between the first and second wafers W1 and W2 bonded to each other may be greater than the adhesion force in the first crystal orientation ([100] direction in FIGS. 11 and 12).

The wafer may be formed of an anisotropic crystalline material whose material properties depend on orientation relative to the crystal lattice. As illustrated in FIGS. 11 and 12, the wafer W may have a first Young's modulus Y1 in the [100] direction and a second Young's modulus Y2 in the [110] direction. The second Young's modulus Y2 is greater than the first Young's modulus Y1. Accordingly, a strain rate in the [100] direction may be greater than a strain rate in the [110] direction.

Since the middle region of the first wafer W1 is deformed such that it protrudes, and is then bonded to the second wafer W2, restoring forces may be generated on the bonding surfaces of the first and second wafers W1 and W2 bonded to each other. Since the strain rate in the first crystal orientation ([100] direction) is greater than the strain rate in the second crystal orientation ([110] direction), an overlay distortion between the wafers W1 and W2 may occur during a subsequent annealing process.

According to exemplary embodiments, because the local plasma process is performed such that the adhesion force in the second crystal orientation ([110] direction) between the first and second wafers W1 and W2 is greater than the adhesion force in the first crystal orientation ([100] direction), more deformations may be generated in the first crystal orientation relative to the second crystal orientation during the annealing process, thereby reducing or preventing the overlay distortion between the wafers W1 and W2.

As described above, according to exemplary embodiments, different restoring forces to be generated due to an elastic modulus difference depending on the orientation of a crystal lattice of a wafer from among wafers bonded to each other by a wafer bonding apparatus may be predicted, and a plasma processing apparatus may perform a local plasma process corresponding to the orientation of the crystal lattice in a bonding surface of the wafer. As a result, an overlay distortion between the bonded wafers may be prevented or reduced.

The above-described wafer to wafer bonding system and wafer to wafer bonding method may be used to manufacture, for example, semiconductor packages or image sensors including logic devices and memory devices. For example, the semiconductor packages may include volatile memory devices such as DRAM devices and SRAM devices, or non-volatile memory devices such as flash memory devices, PRAM devices, MRAM devices, ReRAM devices, etc. The image sensor may include a CMOS image sensor.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A wafer to wafer bonding method, comprising:
   performing a plasma process on a bonding surface of a first wafer by generating a first plasma density in a first direction from a center of the first wafer, and generating a second plasma density greater than the first plasma density in a second direction oriented to the first direction at a predetermined angle along a circumferential direction about the center of the first wafer;
   pressurizing the first wafer after performing the plasma process on the bonding surface of the first wafer, wherein a middle portion of the first wafer protrudes after pressurizing the first wafer; and
   bonding the first wafer to a second wafer by gradually joining the first wafer to the second wafer from the middle portion of the first wafer to a peripheral region of the first wafer.

2. The method of claim 1, wherein
   the first direction corresponds to a first crystal orientation of the first wafer, and the second direction corresponds to a second crystal orientation different from the first crystal orientation.

3. The method of claim 2, wherein the first wafer has a first Young's modulus in the first crystal orientation and the second wafer bonded to the first wafer has a second Young's modulus in the second crystal orientation.

4. The method of claim 2, wherein the first crystal orientation is in a [100] direction and the second crystal orientation is in a [110] direction.

5. The method of claim 1, wherein the second direction is oriented to the first direction at about 45° along the circumferential direction about the center of the first wafer.

6. The method of claim 1, wherein performing the plasma process comprises:
   supplying a plasma gas onto the bonding surface of the first wafer through a shower head,
   wherein the shower head comprises:
   a first group of discharge holes through which the plasma gas is sprayed out with a first discharge amount in the first direction; and
   a second group of discharge holes through which the plasma gas is sprayed out with a second discharge amount greater than the first discharge amount in the second direction.

7. The method of claim 6, wherein a number of discharge holes included in the second group of discharge holes is greater than a number of discharge holes included in the first group of discharge holes.

8. The method of claim 6, wherein the second direction is oriented to the first direction at about 45° along the circumferential direction about the center of the first wafer.

9. The method of claim 6, wherein the first wafer has a first Young's modulus in a first crystal orientation of the first wafer, and the second wafer bonded to the first wafer has a second Young's modulus in a second crystal orientation of the second wafer bonded to the first wafer,
   wherein the second crystal orientation is different from the first crystal orientation.

10. The method of claim 6, wherein an opening area of the second group of discharge holes is greater than an opening area of the first group of discharge holes.

11. The method of claim 1, further comprising:
    cleaning the first wafer after performing the plasma process on the first wafer.

12. The method of claim 1, wherein performing the plasma process comprises:
    spraying out a plasma gas with a first discharge amount in the first direction; and
    spraying out the plasma gas with a second discharge amount greater than the first discharge amount in the second direction.

13. The method of claim 1, further comprising:
    annealing the first wafer and the second wafer after bonding the first wafer to the second wafer.

* * * * *